(12) United States Patent
Yin et al.

(10) Patent No.: US 6,379,575 B1
(45) Date of Patent: Apr. 30, 2002

(54) TREATMENT OF ETCHING CHAMBERS USING ACTIVATED CLEANING GAS

(75) Inventors: Gerald Zheyao Yin, Cupertino; Xue-Yu Qian, Milpitas; Patrick L. Leahey, San Jose; Jonathan D. Mohn, Saratoga; Waiching Chow; Arthur Y. Chen, both of Fremont; Zhi-Wen Sun; Brian K. Hatcher, both of San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/955,181

(22) Filed: Oct. 21, 1997

(51) Int. Cl.$^7$ .............................................. H01L 21/302
(52) U.S. Cl. .................. 216/67; 134/1.1; 438/727; 438/905
(58) Field of Search ........................ 134/1, 1.1, 2, 31, 134/22.1; 156/345; 438/905, 730, 719, 725, 727; 216/67

(56) References Cited

U.S. PATENT DOCUMENTS

| | | | |
|---|---|---|---|
| 4,282,267 A | 8/1981 | Kuyel | 427/38 |
| 4,433,228 A | 2/1984 | Nishimatsu et al. | 219/10.55 R |
| 4,576,692 A | 3/1986 | Fukuta et al. | 204/165 |
| 4,738,748 A | 4/1988 | Kisa | 156/643 |
| 4,786,352 A | 11/1988 | Benzing | 156/645 |

(List continued on next page.)

FOREIGN PATENT DOCUMENTS

| | | |
|---|---|---|
| DE | 4132559 A1 | 4/1993 |
| EP | 0555546 A1 | 8/1993 |
| EP | 697467 A1 * | 2/1996 |
| EP | 0697467 A1 | 2/1996 |
| EP | 0790635 | 2/1997 |

(List continued on next page.)

OTHER PUBLICATIONS

PCT International Preliminary ExaminationReport dated Feb. 14, 2000. PCT/US98/21865.

PCT Search Report dated Oct. 28, 1999. application No. PCT/US99/14922.

PCT Notification of Transmittal of the International Search Report, dated Feb. 4, 1999. PCT/US98/21865.

International Search Report, dated Feb. 18, 1999.

U.S. Patent Application entitled, "Method for Improved Cleaning of Substrate Processing System"; filed Jul. 11, 1997; Ser. No. Unknown: Inventors: Kao, et al.; Attorney Docket No. 2027.

(List continued on next page.)

*Primary Examiner*—Anita Alanko
(74) *Attorney, Agent, or Firm*—Janah and Associates; Joseph Bach

(57) ABSTRACT

An apparatus 20 and process for treating and conditioning an etching chamber 30, and cleaning a thin, non-homogeneous, etch residue on the walls 45 and components of the etching chamber 30. In the etching step, a substrate 25 is etched in the etching chamber 30 to deposit a thin etch residue layer on the surfaces of the walls and components in the chamber. In the cleaning step, cleaning gas is introduced into a remote chamber 40 adjacent to the etching chamber 30, and microwave or RF energy is applied inside the remote chamber to form an activated cleaning gas. A short burst of activated cleaning gas at a high flow rate is introduced into the etching chamber 30 to clean the etch residue on the walls 45 and components of the etching chamber. The method is particularly useful for cleaning etch residue that is chemically adhered to ceramic surfaces in the chamber, for example surfaces comprising aluminum nitride, boron carbide, boron nitride, diamond, silicon oxide, silicon carbide, silicon nitride, titanium oxide, titanium carbide, yttrium oxide, zirconium oxide, or mixtures thereof.

47 Claims, 4 Drawing Sheets

U.S. PATENT DOCUMENTS

| | | | |
|---|---|---|---|
| 4,818,326 A | 4/1989 | Liu et al. ................... | 156/345 |
| 4,831,963 A | 5/1989 | Saito et al. ................ | 118/723 |
| 4,863,561 A | 9/1989 | Freeman et al. ........... | 156/646 |
| 4,867,841 A | 9/1989 | Loewenstein et al. ...... | 156/643 |
| 4,876,212 A | 10/1989 | Koury ......................... | 437/34 |
| 4,975,144 A | 12/1990 | Yamazaki et al. .......... | 156/643 |
| 5,002,632 A | 3/1991 | Loewenstein et al. ...... | 156/643 |
| 5,084,126 A | 1/1992 | McKee ....................... | 156/345 |
| 5,158,644 A | 10/1992 | Cheung et al. ............ | 156/643 |
| 5,164,330 A | 11/1992 | Davis et al. ................ | 437/192 |
| 5,207,836 A * | 5/1993 | Chang ......................... | 134/1 |
| 5,281,302 A * | 1/1994 | Gabric et al. .............. | 156/643 |
| 5,282,899 A | 2/1994 | Balmashnov et al. ... | 118/723 R |
| 5,312,519 A | 5/1994 | Sakai et al. .................. | 134/1 |
| 5,318,668 A | 6/1994 | Tamaki et al. .............. | 156/662 |
| 5,356,478 A * | 10/1994 | Chen et al. .................. | 134/1 |
| 5,382,316 A | 1/1995 | Hills et al. .................. | 156/643 |
| 5,389,197 A | 2/1995 | Ishimaru ..................... | 156/643 |
| 5,413,954 A | 5/1995 | Aydil et al. .................. | 437/81 |
| 5,443,686 A | 8/1995 | Jones et al. .................. | 216/37 |
| 5,449,411 A | 9/1995 | Fukuda et al. ........ | 118/723 MP |
| 5,585,012 A * | 12/1996 | Wu et al. .................... | 216/71 |
| 5,620,615 A | 4/1997 | Keller ......................... | 438/720 |
| 5,626,775 A | 5/1997 | Roberts et al. .............. | 216/67 |
| 5,637,237 A | 6/1997 | Oehrlein et al. ............. | 216/67 |
| 5,644,153 A | 7/1997 | Keller ......................... | 257/324 |
| 5,756,400 A * | 5/1998 | Ye et al. ...................... | 438/710 |
| 5,767,021 A | 6/1998 | Imai et al. ................... | 438/719 |
| 5,788,778 A * | 8/1998 | Shang et al. ................. | 134/1 |
| 5,788,799 A * | 8/1998 | Steger et al. ............... | 156/345 |
| 5,811,022 A * | 9/1998 | Savas et al. .................. | 216/68 |
| 5,817,534 A * | 10/1998 | Ye et al. ....................... | 438/10 |
| 5,817,578 A * | 10/1998 | Ogawa ....................... | 134/1.1 |
| 5,843,239 A * | 12/1998 | Shrotriya .................... | 134/1.1 |
| 5,849,092 A * | 12/1998 | Xi et al. ...................... | 134/1.1 |
| 5,861,601 A * | 1/1999 | Sato et al. ............. | 219/121.43 |
| 5,869,401 A | 2/1999 | Brunemeir et al. ......... | 438/710 |
| 5,879,575 A | 3/1999 | Tepman et al. .............. | 216/68 |
| 5,908,319 A * | 6/1999 | Xu et al. ..................... | 438/725 |
| 5,983,828 A * | 11/1999 | Savas .......................... | 216/68 |
| 6,003,526 A * | 12/1999 | Lo et al. ....................... | 134/1.1 |

FOREIGN PATENT DOCUMENTS

| | | | |
|---|---|---|---|
| JP | 62040728 | | 8/1985 |
| JP | 62-40728 A | * | 2/1987 |
| JP | 03-170678 A | * | 7/1991 |
| JP | 04-214873 A | * | 8/1992 |
| JP | 6177092 A | | 6/1994 |
| JP | 7029879 A | | 1/1995 |
| JP | 07-326605 A | * | 12/1995 |
| JP | 08-031752 A | * | 2/1996 |
| WO | 9615545 | | 5/1996 |

OTHER PUBLICATIONS

U.S. Patent Application entitled, "Apparatus for Improved Remote Microwave Plasma source for Use with Substrate Processing Systems"; filed Apr. 23, 1997; Ser. No. 08/839,111; Inventors: Kao, et al.; Attorney No. 1975.

U.S. Patent Application entitled, "Method and Apparatus for Determining the Endpoint in a Plasma Cleaning Process"; filed Jul. 2, 1997; Ser. No. 08/887,165; Inventors: Subrahmanyam, et al.; Attorney Docket No. 1852.

U.S. Patent Application entitled, "Apparatus and Method for Efficient and Compact Remote Microwave Plasma Generation"; filed Apr. 22, 1997; Ser. No. 08/839,007; Inventor: Bhatnagar; Attorney Docket No. 1772.

U.S. Patent Application entitled, "Method and Apparatus for Pre–stabilized Plasma Generation for Microwave Clean Applications"; filed Nov. 13, 1996; Ser. No. 08/746,658; Inventors: Fong, et al.; Attorney Docket No. 1680–14.

U.S. Patent Application entitled, "Inductively Coupled HDP–CVD Reactor"; filed May 29, 1997; Ser. No. 08/865,018; Inventors: Redeker, et al.; Attorney Docket No. 1570–02.

U.S. Patent Application entitled, "Symmetric Tunable Inductively Coupled HDP–CVD Reactor"; filed Jul. 15, 1996; Ser. No. 08/679,927; Inventors: Redeker, et al.; Attorney Docket No. 1570.

U.S. Patent Application entitled, "Apparatus and Methods for Upgraded Substrate Processing System with Microwave Plasma Source"; filed Mar. 5, 1997; Ser. No. 08/811,627; Inventors: Tanaka, et al.; Attorney Docket No. 1480.

U.S. Patent Application entitled, "Microwave Apparatus for In–situ Vacuum Line cleaning for Substrate Processing Equipment"; filed Oct. 30, 1996; Ser. No. 08/741,241; Inventors: Pang, et al.; Attorney Docket No. 1529.

* cited by examiner

TREATMENT OF ETCHING CHAMBERS USING ACTIVATED CLEANING GAS

BACKGROUND

The present invention relates to an etching chamber and a method for etching substrates and for cleaning and conditioning the surfaces of the chamber.

In the manufacture of integrated circuits, silicon dioxide, polysilicon, tungsten silicide, and metal layers on a substrate, are etched in predefined patterns to form gates, vias, contact holes, or interconnect lines. In the etching process, a patterned mask layer, such as an oxide hard mask or a photoresist layer, is formed on the substrate using conventional photolithographic methods, and the exposed portions of the substrate are etched by capacitive or inductively coupled plasmas. Commonly used etchant halogen gases include fluorinated gases such as $CF_4$, $SF_6$, and $NF_3$; chlorinated gases such as $Cl_2$, $CCl_4$, $SiCl_4$, and $BCl_3$; and brominated gases such as HBr, Br, and $CH_3Br$.

In the etching process, the etching chamber is contaminated by a thin etch residue layer that deposits on the walls and other components in the chamber. The composition of the etch residue layer depends upon the etchant gases, the material being etched, and the composition of the mask layer applied to the substrate. When silicon is etched, silicon-containing gaseous species vaporized or sputtered from the substrate are present in the chamber environment; and when metal species are etched, metal ions are present in the chamber environment. The resist or mask layer on the substrate is also partially etched away by the etchant gas to form gaseous hydrocarbon or oxygen species in the chamber. These different species combine within the chamber environment to form polymeric byproducts containing hydrocarbons, elemental silicon or metal species, and often also contain oxygen, nitrogen or boron. The polymeric byproducts deposit as thin etch residue layers on the walls and components in the chamber. The composition of the etch residue layer can vary widely across the chamber depending upon the composition of the localized gaseous environment.

The non-homogeneous, etch residue layer formed in the etching process has to be periodically cleaned to prevent contamination of the substrate, and to provide internal chamber surfaces that have consistent and homogeneous chemical compositions and surface functionality, otherwise the etching processes performed in the chamber can varying widely in etching properties. In a traditional wet cleaning process, an operator periodically shuts down the etching machine, and uses an acid or solvent to scrub down the chamber walls. In the competitive semiconductor industry, the increased per substrate cost arising from downtime of the etching chamber, is undesirable. Also, because the wet cleaning process is manually performed by an operator, it often varies from one session to another, and limits the reproducibility of the etching process conducted in the chamber.

Another commonly used etch chamber cleaning method uses an insitu ionized plasma which is generated inside the etch chamber, to clean the chamber walls. However, the in-situ ionized plasma species are highly energetic and can rapidly erode the chamber walls and chamber components. It is expensive to periodically replace the eroded parts and components in the chamber. Also, surface erosion of the chamber surfaces and components by the energetic plasma species, can often result in the instability and lack of reproducibility of subsequent plasma etching process steps performed in the chamber. For example, variations in the concentration, type, or surface functional bonds or chemical groups on the exposed surfaces of the walls and components in the chamber, affect the sticking coefficient of gases and vapors on these surfaces, and consequently, the gaseous plasma etching chemistry in the chamber. Chamber surfaces having excessively active surface functional groups can deplete the concentration of gaseous chemical species needed to etch the substrate. Furthermore, the relatively high plasma power levels required to achieve acceptable cleaning rates tend to generate residue byproducts that damage system components and which cannot be removed except by physically wiping the internal surfaces of the chamber. For example, $NF_3$ plasma used to clean aluminum chamber surfaces results in formation of $Al_xF_y$ compounds that cannot be etched away by nonchemical processes. As another example, $NF_3$ gas that is used to clean $Si_3N_4$ CVD deposition systems result in formation of $N_xH_yF_z$ compounds that are deposited on the exhaust or vacuum pump and affect the reliability of the exhaust pump.

In chemical vapor deposition (CVD) processes, cleaning gases that are activated by microwaves in a remote chamber and further energized by capacitive coupled plasmas in-situ in the CVD chamber, have been used to clean the relatively thick and homogeneous CVD deposit layers formed in these chambers. In a typical CVD process, reactive gases are used to deposit a layer of material, such as aluminum or silicon dioxide, on the substrate. During the deposition process, the CVD deposits that are formed on the chamber walls and surfaces are often as thick as the CVD layers deposited on the substrate. The CVD deposits also have a relatively uniform and homogeneous chemical composition that corresponds to the material deposited on the substrate. The thick and chemically homogeneous CVD deposits can be cleaned by a high power microwave and capacitive coupled plasma, as for example, described in U.S. Pat. No. 5,449,411, which is incorporated herein by reference. In another example, commonly assigned European Patent No. 555 546 A1 discloses a process for CVD of silicon and removal of silicon deposits from the walls of the CVD chamber using a microwave plasma of $NF_3$ or $CF_4/O_2$. Similarly, German Patent No. 4,132,559 A1 also describes a method of cleaning a CVD deposition chamber using a remotely generated microwave plasma of $NF_3$.

However, the CVD chamber cleaning processes for cleaning thick and stoichiometrically homogeneous CVD deposits in deposition chambers are not suitable for cleaning the thin, variable composition, etch residue layers formed on the inner surfaces of etching chambers. The thin etch residue layers make it difficult to stop the cleaning process, after removal of the residue layer, resulting in extensive erosion of the underlying chamber surfaces. Also, the variable chemical stoichiometry and composition of the etch residue layers at different portions of the chamber make it difficult to clean all of the residue. For example, the etch residue formed near the chamber inlet or exhaust is often thinner and has a higher concentration of etchant gas species (or of material being etched) than etch residue formed near the substrate which typically contains a higher concentration of polymeric or oxide mask species. It is extremely difficult to generate a plasma or gas that uniformly etches away the variable stoichiometric composition etch residue without either eroding the chamber walls below the thin soft residue layers, or conversely, failing to clean-off thick and chemically hard residue layers. For these reasons, known methods of cleaning CVD deposits in deposition chambers are ineffective at cleaning the ultra thin and compositional variant etch residue layers formed on the walls and components of etching chamber without damaging or eroding the underlying walls and component surfaces.

Thus, it is desirable to have a treatment process that maximizes the chemical reactivity of the cleaning gas to etchant deposits in an etching chamber and that minimizes the chemical reactivity of the cleaning gas to the exposed surfaces in the chamber. It is further desirable to have a method for treating the etching chamber that removes chemically adhered etchant deposits from chemically active surfaces in the chamber and restores the original chemical reactivity and surface functional groups of these surfaces. It is further desirable for the chamber cleaning process to remove etch residues having variable thickness and non-uniform chemical stoichiometry, without excessive erosion of the chamber walls and components.

SUMMARY

The present invention provides an apparatus and method of etching a substrate in an etching chamber, cleaning a non-homogeneous, variable composition, etch residue layer from the walls and components of an etching chamber, and treating and conditioning ceramic surfaces in the chamber to provide highly consistent and reproducible etching performance. In the etching step, a substrate is etched in the etching chamber thereby depositing a thin etch residue layer on the surfaces of the walls and components in the etching chamber. In the cleaning step, cleaning gas is activated in a remote chamber adjacent to the etching chamber, for example, by applying microwave or RF energy in the remote chamber. The activated cleaning gas is introduced into the etching chamber to clean the etch residue on the walls and components of the etching chamber. It has been discovered that this method is particularly useful for cleaning etch residue strongly adhered to, or chemically reacted with, ceramic surfaces comprising aluminum nitride, boron carbide, boron nitride, diamond, silicon oxide, silicon carbide, silicon nitride, titanium oxide, titanium carbide, yttrium oxide, zirconium oxide, or mixtures thereof.

When etching certain materials, for example, silicon-containing layers, a relatively thin etch residue layer containing primarily polymeric, oxygen, and silicon-containing species, and having a thickness of about 0.01 to about 1 micron is formed on the chamber walls and surfaces. It has been discovered that such an etchant layer can be efficiently removed by a high flow rate, short burst of activated cleaning gas introduced into the etching chamber at a flow rate $F_R$ equivalent to a rate of about 200 to about 2000 sccm for a chamber having a volume of about 40,000 $cm^3$ for a time period of about 0.5 to about 100 seconds to clean the etch residue, substantially without eroding the walls and components in the chamber.

Preferably, the cleaning process is performed while or immediately after, the substrate is being transported out of the etching chamber, to increase throughput from the etching chamber. Preferably, a short burst of a high flow rate of activated cleaning gas is introduced into the etching chamber for a short time period, while substrate is being transported in or out of the chamber, to clean and condition the surfaces in the chamber without eroding chamber surfaces or substrate surfaces. Another substrate is then transported into the chamber and the etching, transportation, and cleaning and conditioning steps are repeated, until the substrate supply is exhausted. In a preferred version, the remote chamber is maintained at a higher pressure than the etch chamber, to provide a more laminar flow of cleaning gas along the sidewalls and surfaces of the chamber.

It has further been discovered, in accordance with another aspect of the present invention, that superior cleaning and conditioning of etching chamber surfaces that are highly reactive to etch residue is achieved by introducing the activated gas into the chamber in multiple and discrete stages. The multicycle conditioning process comprises (i) a first stage, in which a first activated cleaning gas formed by maintaining the gas activator in the remote chamber at a first power level, is introduced into the etching chamber; and (ii) at least one second stage, in which a second activated cleaning gas formed by maintaining the gas activator in the remote chamber at a second power level different from the first power level, is introduced into the etching chamber. The cleaning gas in the first stage contains a more dissociated and chemically reactive species that removes the hard and thick etch residues at the chamber walls and components near the substrate. The cleaning gas in the second cleaning stage is activated at a lower power level to more gently treat and condition surfaces such as ceramic surfaces. The duration of each cleaning stage is from about 0.5 to about 100 seconds, and more preferably, from about 0.5 to about 94 seconds. The multicycle process can be repeated a sufficient number of times to treat the chamber walls and reduce the concentration of etch residue to the desirable level.

In yet another aspect, the present invention is to an etching apparatus comprises an etching chamber having a process gas inlet for introducing process gas into the chamber, a plasma generator for forming a plasma from the process gas for etching a substrate, and an exhaust system for exhausting the spent process gas from the etching chamber. A remote chamber adjacent to the etching chamber is used to generate an activated cleaning gas. A gas distribution system comprises (i) a gas conduit for transporting the activated cleaning gas from the remote chamber to the etching chamber, (ii) a gas flow distributor for directing the flow of activated cleaning gas substantially parallel, and adjacent to, one or more internal surfaces of the chamber, and (iii) a gas flow regulator for regulating the flow of activated cleaning gas into the gas flow distributor. Preferably, the gas flow distributor has nozzles positioned adjacent to surfaces in the chamber that have thicker etch residue layers, for directing the flow of activated cleaning gas to these regions to preferentially remove the thicker etch residue layers without eroding portions of the chamber having thinner etch residue layers.

DRAWINGS

These and other features, aspects, and advantages of the present invention will be better understood from the following drawings, description and appended claims, which illustrate examples of the invention. While the description and drawings below illustrate exemplary features of the invention, it is to be understood that each of the features can be used in the invention in general, not merely in the context of the particular drawings, and the invention includes any combination of these features.

DESCRIPTION

Figure 1:
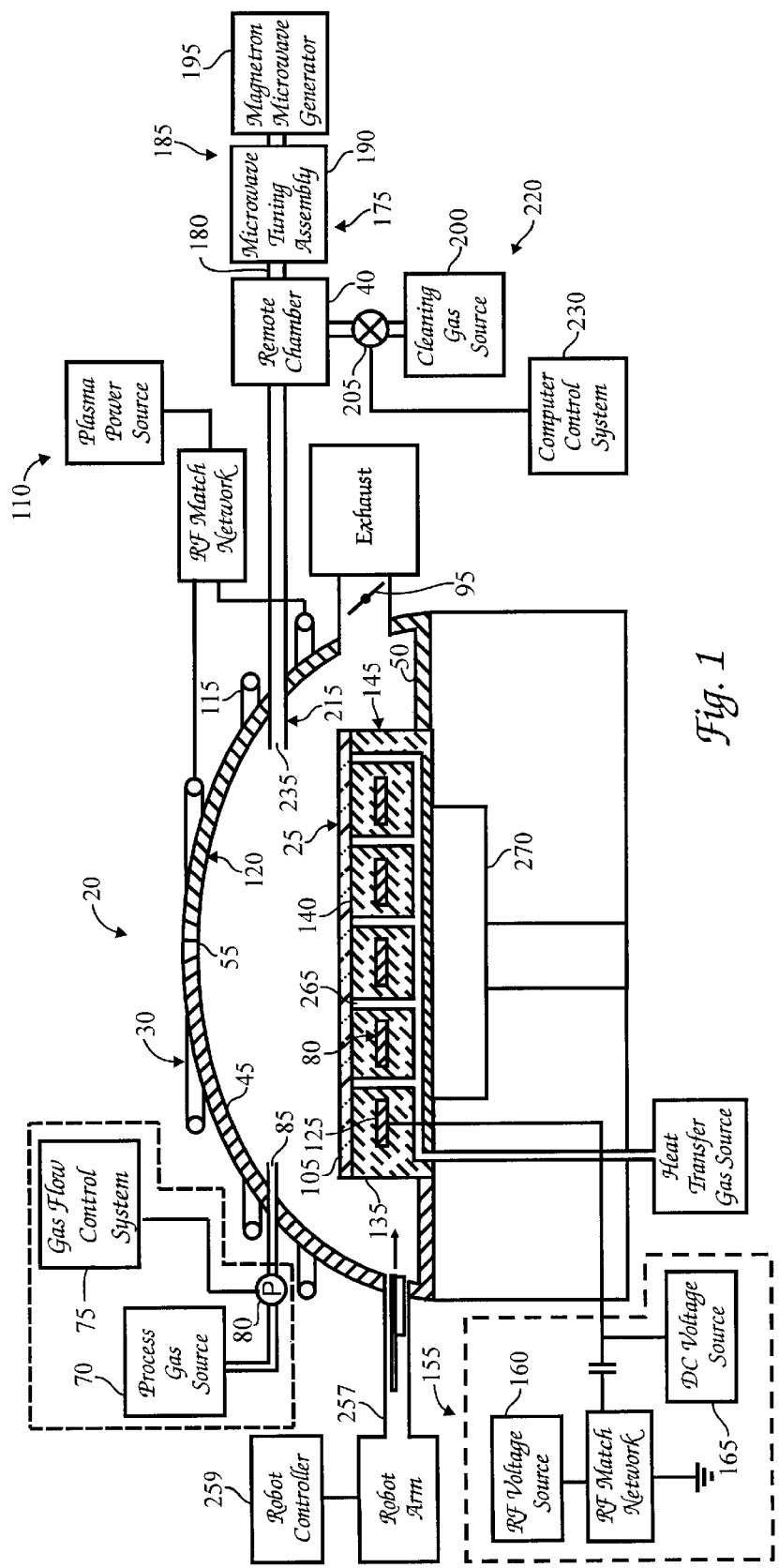
FIG. 1 is a sectional schematic side view of an etching apparatus of the present invention.

An apparatus 20 suitable for etching a substrate 25 according to the present invention, as schematically illustrated in FIG. 1, comprises an enclosed process chamber 30 defining a process zone for processing the substrate, a remote chamber 40 for forming an activated cleaning gas, and a load-lock transfer area (not shown) maintained at low pressure for holding a cassette of substrates. The particular embodiment of the apparatus 20 shown herein is suitable for processing of semiconductor substrates 25 is provided only to illustrate the invention and should not be used to limit the scope of the invention. Particular features of the apparatus 20 are described in U.S. patent application Ser. No. 08/597,445, now U.S. Pat. No. 5,777,289, entitled "RF Plasma Reactor with Hybrid Conductor and Multi-Radius Dome Ceiling," filed on Feb. 2, 1996; and in U.S. patent application Ser. No. 08/389,889, now U.S. Pat. No. 5,753,044, filed on Feb. 15, 1993—both of which are incorporated herein by reference. The enclosed chamber 30 has sidewalls 45 and a bottom wall 50 fabricated from any one of a variety of materials including metals, ceramics, glasses, polymers, and composite materials. The process zone defined in the etching chamber 30 is directly above and surrounds the substrate 25 and comprises a volume of at least about 10,000 cm$^3$, and more preferably about 10,000 to about 50,000 cm$^3$. Metals commonly used to fabricate the enclosed chamber 30 include aluminum, anodized aluminum, "HAYNES 242," "Al-6061," "SS 304," "SS 316," and INCONEL, of which anodized aluminum is preferred.

The process zone comprises a ceiling 55 that is flat or rectangular shaped, arcuate, conical, dome-shaped, or multiradius dome shaped. Preferably, the ceiling 55 is dome-shaped to provide a uniform distribution of plasma source power across the entire volume of the plasma process zone to increase dissociation of the etchant gas within the plasma zone, as for example described in U.S. patent application Ser. No. 08/596,960, now U.S. Pat. No. 5,779,926, entitled "Plasma Process for Etching Multicomponent Alloys," filed on Feb. 5, 1996, to Ma et al., which is incorporated herein by reference. The dome-shaped ceiling 55 reduces dissociated ion recombination losses near the substrate 25 so that plasma ion density is more uniform across the substrate than with a flat ceiling. This is because ion recombination losses are affected by the proximity of the ceiling 55, and the dome-shaped ceiling is further from the substrate center 60 than a flat ceiling. The dome ceiling 55 can be planar (i.e., flattened dome), conical, truncated conical, cylindrical, or other combination of such shapes, that provides a dome shaped surface above the substrate 25.

Process gas is introduced into the chamber 30 through a gas distribution system 65 that includes a process gas supply 70 and a gas flow control system 75 that operates gas flow meters 80. The gas distribution system 65 can comprise gas outlets 85 located peripherally around the substrate 25 (as shown), or a showerhead mounted on the ceiling of the chamber 30 with outlets therein (not shown). Spent process gas and etchant byproducts are exhausted from the process chamber 30 through an exhaust system 90 (typically including a 1000 liter/sec roughing pump) capable of achieving a minimum pressure of about 10$^{-3}$ mTorr in the chamber 30. A throttle valve 95 is provided in the exhaust 90 to control the flow of spent process gas and the pressure of process gas in the chamber 30. Preferably, an asymmetric pumping channel is used to pump gases out of the chamber 30 to provide a more symmetrical and uniform distribution of gaseous species around the surface 105 of the substrate 25.

A plasma is formed from the process gas introduced into the chamber 30, using a plasma generator 110 that couples an electric field into the process zone of the chamber. A suitable plasma generator 110 comprises an inductor antenna 115 consisting of one or more inductor coils having a circular symmetry with a central axis coincident with the longitudinal vertical axis that extends through the center of the process chamber 30 and perpendicular to the plane of the substrate 25. Preferably, the inductor antenna 115 comprises solenoid coils having from 1 to 10 turns, and more typically from 2 to 6 turns. The arrangement and number of solenoid coils are selected to provide the desired product of current and antenna turns (d/dt)(N·l) near the ceiling 55 to provide a strong inductive flux linkage with close coupling to the plasma and therefore greater plasma ion density in the plasma zone adjacent to the substrate 25, as described in U.S. patent application Ser. No. 08/648,254 now U.S. Pat. No. 6,165,311. When the inductor antenna 115 is positioned near the dome ceiling 55, the ceiling of the chamber 30 comprises dielectric material which is transparent to RF fields, such as a slab of machined silicon dioxide or tiles of silicon or silicon dioxide bonded to one another to provide a curved shape. Preferably, the inductor coil 115 wrapped around the sidewall 45 of the process chamber 30 is a multiradius dome-shaped inductor coil having a "flattened" dome shape that provides increased plasma ion density directly over the substrate center 60 because ion density is affected by local ionization near the inductor coil 115, and a multiradius inductor coil is closer to the substrate center 60 than a hemispherical coil. In another preferred embodiment, the ceiling 55 comprises a multiradius dome having at least a center radius R and a corner radius r, wherein r is less than the center radius R and R/r is from about 2 to about 10.

The plasma formed in the plasma zone can also be enhanced using magnetically enhanced reactors, in which a magnetic field generator (not shown), such as a permanent magnet or electromagnetic coils, are used to apply a magnetic field in the plasma zone to increase the density and uniformity of the plasma. Preferably, the magnetic field comprises a rotating magnetic field with the axis of the field rotating parallel to the plane of the substrate 25, as described in U.S. Pat. No. 4,842,683, issued Jun. 27, 1989, which is incorporated herein by reference. The magnetic field in the chamber 30 should be sufficiently strong to increase the density of the ions formed in the plasma, and sufficiently uniform to reduce charge-up damage to features such as CMOS gates. Generally, the magnetic field as measured on the surface 105 of the substrate is less than about 500 Gauss, more typically from about 10 to about 100 Gauss, and most typically from about 10 Gauss to about 30 Gauss.

In addition to the inductor antenna 115, one or more process electrodes can be used to accelerate or energize the plasma ions in the chamber 30. The process electrodes include a first electrode 120 forming a wall of the process chamber 30, such as the ceiling 55 and/or sidewalls 45 of the chamber. The first electrode 120 is capacitively coupled to a second electrode 125 below the substrate 25. An electrode voltage supply 155 supplies an RF potential that maintains the first and second electrodes 120, 125 at different electrical potentials relative to one another. The frequency of the RF voltage applied to the inductor antenna 115 is typically about 50 KHz to about 60 MHz, and more typically about 13.56 MHz; and the power level of RF voltage applied to the antenna is about 100 to about 5000 Watts.

The enclosed chamber 30 comprises one or more ceramic surfaces that serve different functions. For example, in one preferred embodiment, the walls 45, 50, 55 of the process chamber are coated with a ceramic material, such as boron carbide, boron nitride, silicon, silicon oxide, silicon carbide, or silicon nitride, to protect the walls from chemically erosion in particular etchant gas compositions. For example, boron carbide is useful for protecting sidewalls 45 of chambers from erosion in fluorinated gaseous environments. As another example, sapphire (aluminum oxide) gas distribution plates can be used to release process gas into the chamber 30.

Another ceramic surface useful in the process chamber 30 is that of a monolithic ceramic member 135 having a ceramic receiving surface 140 for receiving a substrate 25 thereon. Suitable ceramic materials include one or more of aluminum nitride, boron carbide, boron nitride, diamond, silicon oxide, silicon carbide, silicon nitride, titanium oxide, titanium carbide, yttrium oxide, and zirconium oxide. The ceramic member 135 is fabricated from a low porosity ceramic having a porosity of less than about 10%. The thermal conductivity of the dielectric material preferably comprises a high conductivity of about 80 to about 240 Watts/m K, for example, diamond or aluminum nitride. The second electrode 125 is embedded in the ceramic member 135 so that ceramic material completely surrounds the second electrode to form a unitary monolithic ceramic member. The second electrode 125 is fabricated from a conductive metal such as aluminum, copper, gold, molybdenum, tantalum, titanium, tungsten, and alloys thereof, and more preferably from a high melting point refractory metal, such as tungsten, tantalum or molybdenum, which allows thermal sintering of the ceramic member 135 with the embedded electrode 125 therein. The ceramic member 135 with the embedded electrode 125 can be fabricated by isostatic pressing, hot pressing, mold casting, or tape casting, from a mixture of ceramic powders and a low concentration of organic binder material.

The embedded second electrode 125 in the unitary monolithic ceramic member 135, is the sole conductor to which a "hot" RF potential is applied, with the other electrodes in the chamber 30 maintained at different potentials, including electrical ground or floating potentials, relative to the second electrode 125. Because it is embedded in the unitary ceramic member 135, the second electrode 125 does not have to be electrically isolated from the chamber 30 by additional insulator shields, thereby reducing the parasitic capacitance impedance loads in the chamber 30 that would otherwise result between the second electrode 125 and the grounded chamber walls 45, 50. Also, because there is no insulator shield in the chamber 30, the active area of the second electrode 125 can be increased to cover an area having a diameter that extends across the entire chamber bottom 50, providing a larger active electrode area than conventional cathodes. The second electrode 125 also serves as an electrostatic chuck 145 that generates an electrostatic charge for electrostatically holding the substrate 25 to the receiving surface 140 of the ceramic member 135 using a DC chucking voltage applied through an electrical conductor inserted through the ceramic member 135 to connect to the second electrode 125.

The first and second electrodes 120, 125 are electrically biased relative to one another by the electrode voltage supply 155 that includes an AC voltage 160 supply for providing a plasma generating RF voltage to the second electrode 125, and a DC voltage supply 165 for providing a chucking voltage to the electrode 125. The AC voltage supply 160 provides an RF generating voltage having one or more frequencies from 400 KHz to 13.56 MHz to form a capacitively coupled plasma in the chamber 30. The power level of the RF bias current applied to the electrode 125 is typically from about 50 to about 3000 Watts. A separate DC voltage is applied to the electrode 125 to form an electrostatic charge that holds the substrate 25 to the chuck 145. The RF power is coupled to a bridge circuit and an electrical filter to provide DC chucking power to the electrode 125.

The etching apparatus 20 further comprises a remote chamber 40, such as a quartz tube, adjacent and connected to the process zone of the etching chamber 30 via a gas conduit 170. The remote chamber 40 comprises a gas activator 175 that is used to provide a microwave or RF energy in the chamber 30, to activate the cleaning gas by ionization or dissociation. When microwave energy is supplied, the cleaning gas dissociates to form uncharged atomic species, for example, $Cl_2$ dissociates to form atomic chlorine. When an RF energy is applied to the remote chamber 40, for example, by induction or capacitive coupling, the cleaning gas forms charged ionized species in the remote chamber.

Preferably, the gas activator 175 provides microwaves that chemically activate the cleaning and conditioning gas in the remote chamber by formation of a highly dissociated gas. In this version, as schematically illustrated in FIG. 1, the gas activator 175 comprises a microwave waveguide 180 powered by a microwave generator 185, such as the "ASTEX" Microwave Plasma Generator commercially available from the Applied Science & Technology, Inc., Woburn, Mass. Typically, the microwave generator 185 comprises a microwave tuning assembly 190 and a magnetron microwave generator 195 capable of generating microwaves at a frequency of 2.54 Ghz. Typically, the magnetron 195 comprises a high power microwave oscillator in which the potential energy of an electron cloud near a central cathode is converted into microwave energy in a series of cavity resonators spaced radially around the cathode. The resonant frequency of the magnetron 195 is determined by the physical dimensions of the resonator cavities.

A second gas supply system 220 provides a cleaning gas from a cleaning gas oven to the remote chamber 40 via an electronically operated valve 205 and flow control mechanism at a user-selected flow rate. The microwave generator control system then applies power to the microwave generator 185 to generate microwaves which are transported by the waveguide 180 to the remote chamber 40. The activated cleaning gas is transported from the remote chamber 40 to the etching chamber 30 via a gas distribution system comprising the gas conduit 170. Optionally, a filter is positioned in the conduit 170 through which the activated gas species passes before entering the etching chamber 30 to remove particulate matter that is formed during the activation of the reactive species. In the described embodiment, the filter is made of ceramic material having a pore size of about 0.01 to 0.03 microns. Other materials can also be used, such as Teflon (TM DuPont de Nemours, Inc.), polyimide, inactivated carbon, or sulphur. For example, when the cleaning gas comprises $CF_4$ or $SF_6$, or other halogen compounds containing carbon or sulphur, an activated carbon of sulphur species is often present as a byproduct of the activation process. It is generally desirable to remove such carbon or sulphur products to prevent contamination of the etching chamber environment.

Figure 3:
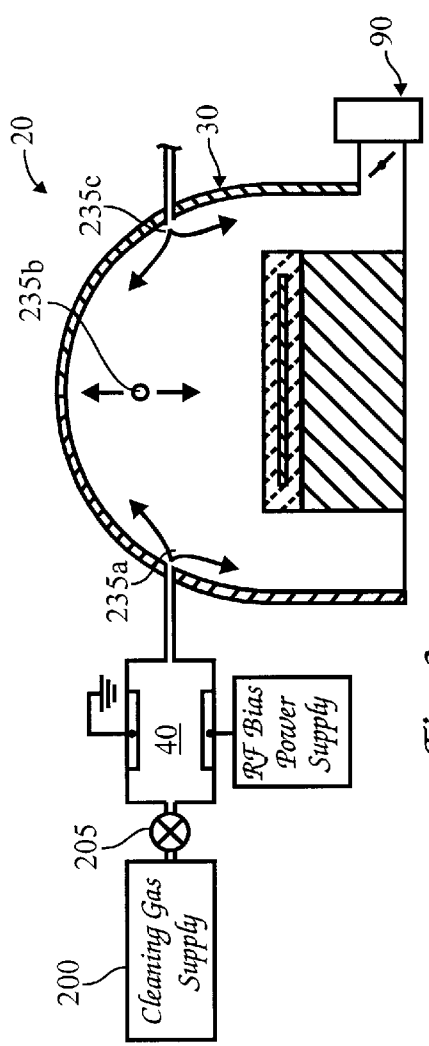
FIG. 3 is a sectional schematic side view of another version of an etching apparatus of the present invention.
Figure 4:
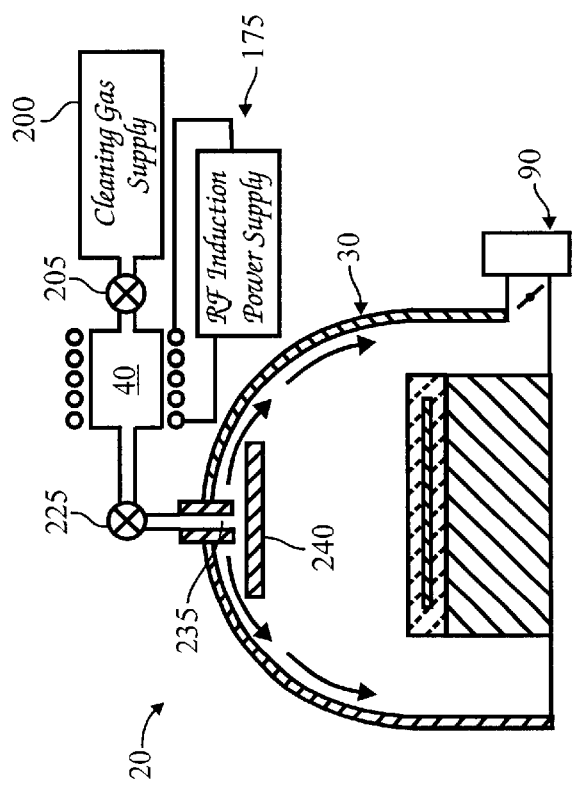
FIG. 4 is a sectional schematic side view of another version of an etching apparatus of the present invention.

Instead of using microwaves, the cleaning gas can also be activated by an RF energy provided by a capacitively or inductively coupled source in or adjacent to the remote chamber 40. A suitable RF energy type gas activator comprises an inductor antenna consisting of one or more inductor coils having a circular symmetry with a central axis coincident with the longitudinal vertical axis that extends through the center of the remote chamber 40, as shown in FIG. 4. Alternatively, the gas activator can also comprise a pair of electrodes positioned within the remote chamber 40 to form a capacitively coupled field in the chamber 40, as shown in FIG. 3.

The gas distribution system further comprises a gas flow distributor 215 for directing the flow of activated cleaning gas substantially parallel, and adjacent to, one or more internal surfaces of the chamber 30 and a gas flow regulator 220 for regulating the flow of activated cleaning gas into the gas flow distributor 215. The gas flow regulator comprises a flow control valve 205 or 225 operated by a conventional computer control system 230 to control the flow of the cleaning gas into the remote chamber 40 at a predefined or user-selected gas flow rate. Optionally, a carrier gas source can also be connected to the remote activation chamber 40 through another valve and flow control mechanism (not shown). The carrier gas assists in transporting the activated cleaning gas to the etching chamber 30, and can be any known gas that is non-reactive or compatible with a particular cleaning process. For example, a suitable carrier gas can be argon, nitrogen, helium, halogen, or oxygen. The carrier gas can also assist in the cleaning process by initiating and/or stabilizing the activated gaseous species in the etching chamber 30.

Preferably, the gas flow distributor 215 directs the flow of the activated cleaning gas generally parallel, or adjacent to, one or more of the surfaces inside the chamber 30, such as the surfaces of the sidewall 45, the bottom surface 50, or the surfaces of components in the chamber. Directing the flow of cleaning gas substantially parallel to certain chamber surfaces provides a more concentrated and laminar flow of cleaning gas adjacent to these surfaces that removes the etch residue and treats and conditions the chamber surfaces more effectively. In the version shown in FIG. 3, the gas distributor comprises a plurality of gas injection nozzles 235a, b, c, arranged symmetrically about a central axis of the chamber 30, to provide a laminar curtain of gas flowing immediately past, adjacent, and substantially parallel to the surfaces of the etching chamber 30 to enhance cleaning of the etch residue on the chamber walls. The gas injection nozzles 235a, b, c provide a cleaning gas flow pattern or flow pathway that is directed along the walls and surfaces of the chamber that have a high concentration, thickness, or more chemically hard composition of etch residue, to preferentially clean and condition these surfaces, without excessive erosion of other portions of the chamber that have less etch residue.

In another version, shown in FIG. 4, the gas distributor 215 comprises one or more gas injection nozzle 235 that is positioned behind a gas spreading or flow redirecting plate 240 in the chamber 30. The gas spreading plate 240 is symmetrically positioned in the chamber with preferably a perpendicular central axis that is substantially aligned to the central axis of the chamber 30. The plate 240 covers the gas injection nozzle 235 and deflects and redirects the flow of cleaning gas emitted from the injection nozzles 235, between the gap defined by the plate and a parallel portion of the chamber surface adjacent to the plate 240. The gas spreader plate 240 is spaced apart and at a predefined distance from the chamber surface to define a gap having a predefined height. The cleaning gas exits the annular ring-shaped outlet defined by the plate 240 and the chamber surface substantially parallel to the chamber surface, and flows in a laminar flow path along the surface of the etching chamber walls.

Figure 5:
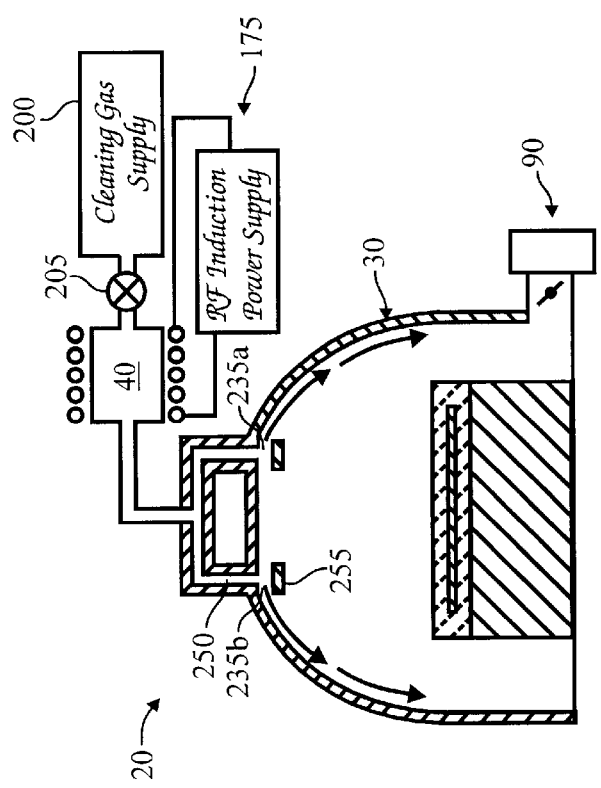
FIG. 5 is a sectional schematic view of another version of an etching apparatus of the present invention.

In yet another configuration, illustrated in FIG. 5, the gas distributor 215 comprises injection nozzles 235a, b at the terminus of a channel 250 that is symmetrically positioned about a central axis of the chamber 30. An annular ledge 255 is spaced apart from, and preferably covers, at least a portion of the channel 250 to form a circumferential collar that directs the flow of cleaning gas along and past particular surfaces of the chamber 30 to recondition and treat these surfaces. As with the gas plate version illustrated in FIG. 4, the annular opening of the channel 250 adjacent to the chamber surfaces, provides a forced flow of cleaning gas past the chamber surfaces.

Figure 6:
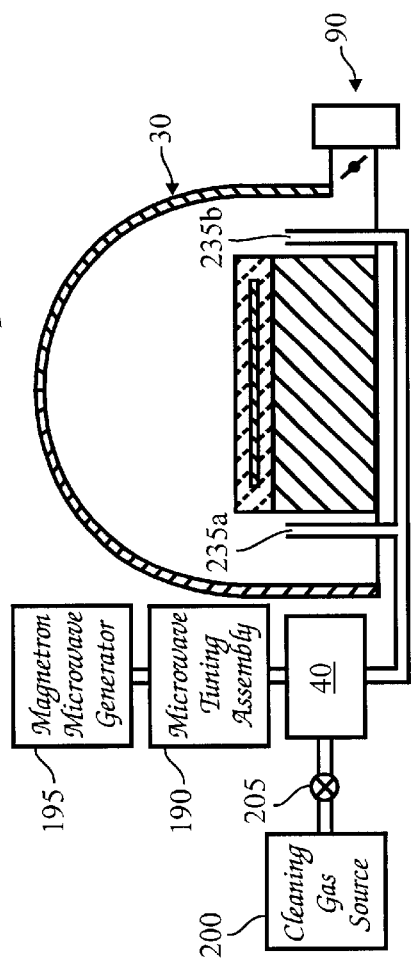
FIG. 6 is a sectional schematic view of another version of an etching apparatus of the present invention.

Preferably, the gas flow distributor 215 comprises gas injection nozzles 235 that are positioned adjacent to surfaces in the chamber 30 that have thicker etch deposit layers, for directing the flow of activated cleaning gas to these regions to preferentially remove the thicker etch residue layers without eroding portions of the chamber 30 having thinner deposit layers. This is particularly useful for etching chambers and processes that produce widely varying composition or thickness of etch residue deposit layers across the surfaces of the chamber 30. Typically, the thicker etch residue regions are adjacent to the substrate, where a larger quantity of resist or mask vaporizes from the substrate, and condenses onto the chamber surfaces. For example, in a preferred configuration, as shown in FIG. 6, the gas injection nozzles 235a, b are positioned in a circle that surrounds the substrate 25 and extend from the bottom wall 50 of the chamber 30. This configuration is preferred for etching processes in which a large amount of etch residue is formed near the chamber surfaces that are next to the substrate, because the etch residue is a condensation byproduct of the resist or oxide mask on the substrate. Similarly, the gas injection nozzles 235a, b can be positioned in the other regions of the chamber 30 as determined from the distribution and etch residue across the chamber surfaces for each type of etch process.

Etching Process

Operation of the etching chamber 30 to etch one or more of the silicon-containing layers on the substrate 25 will now be described with reference to the flow chart of FIG. 2. The substrate 25 typically comprises a semiconductor material, such as a silicon or gallium arsenide wafer, with a plurality of layers formed thereon. The layers on the substrate 25 comprise, for example, an underlayer of silicon dioxide that functions as a gate oxide layer for MOS transistors, an overlayer of polysilicon or patterned polyicide (which is a combination of tungsten silicide and underlying polysilicon layers) and dielectric layers particulary dielectric layers containing silicon. Each of the layers typically have a thickness of about 100 nm to about 350 nm. A mask layer, such as "RISTON" photoresist manufactured by DuPont de Nemours Chemical Company, or an oxide hard mark is applied over the substrate 25 to a thickness of about 0.4 to about 1.3 micron; and the features to be etched in the layers are defined using conventional photolithographic processes. The exposed portions between the mask layer are etched to form features, such as for example, contact holes for fabricating gate electrodes for MOS transistors; polycide interconnecting features that are typically used as gate electrodes; and vias which are multilayer metal structures used to electrically connect two or more electrically conductive layers separated by insulating silicon oxide/nitride layers.

To perform the process of the present invention, a substrate 25 is transferred using a robot arm 257 from a load-lock transfer chamber through a slit valve and into the chamber 30. A lift finger assembly (not shown) has lift fingers that extend through lift finger openings in the chuck 145 to receive or lift the substrate 25 off the chuck 145. The robot arm 257 places the substrate 25 on the tips of the lift fingers (not shown) that are elevated by the pneumatic lift mechanism to extend about 2 to 5 centimeters above the surface of the chuck 145. The pneumatic mechanism, under the control of a computer system, lowers the substrate 25 onto the electrostatic chuck 145, and helium is supplied through apertures 265 in the chuck to control the temperature of the substrate 25.

Etchant gas is introduced into the chamber 30 through the gas outlet 85, and the chamber is typically maintained at a pressure ranging from about 0.1 to about 400 mTorr, and more typically from about 0.1 to 80 mTorr. Suitable halogen-containing etchant gases for etching the substrate 25, include for example, HCl, $BCl_3$, HBr, $Br_2$, $Cl_2$, $CCl_4$, $SiCl_4$, $SF_6$, F, $NF_3$, HF, $CF_3$, $CF_4$, $CH_3F$, $CHF_3$, $C_2H_2F_2$, $C_2H_4F_6$, $C_2F_6$, $C_3F_8$, $C_4F_8$, $C_2HF_5$, $C_4F_{10}$, $CF_2Cl_2$, $CFCl_3$, and mixtures thereof. The etching process of the present invention provides high etch rates, and highly selective etching of the silicon layers on the substrate 25. A preferred composition of process gas comprises (i) chlorine, (ii) hydrogen bromide, and optionally (iii) helium-oxygen gas. The chlorine gas is ionized to form atomic chlorine and chlorine-containing species that etch the metal silicide or polysilicon layers to form volatile $SiCl_x$ species that are exhausted from the chamber 30. The chlorine gas can comprise $Cl_2$ or other chlorine-containing gases equivalent to chlorine, for example, HCl, $BCl_3$, and mixtures thereof. The hydrogen bromide gas enhances the rate of etching of the polysilicon layer while simultaneously reducing the rate of etching of the resist layer to enhance the etching selectivity ratio. The helium-oxygen gas forms excited species and ions that further aid etching rates and etching selectivity.

Figure 2:
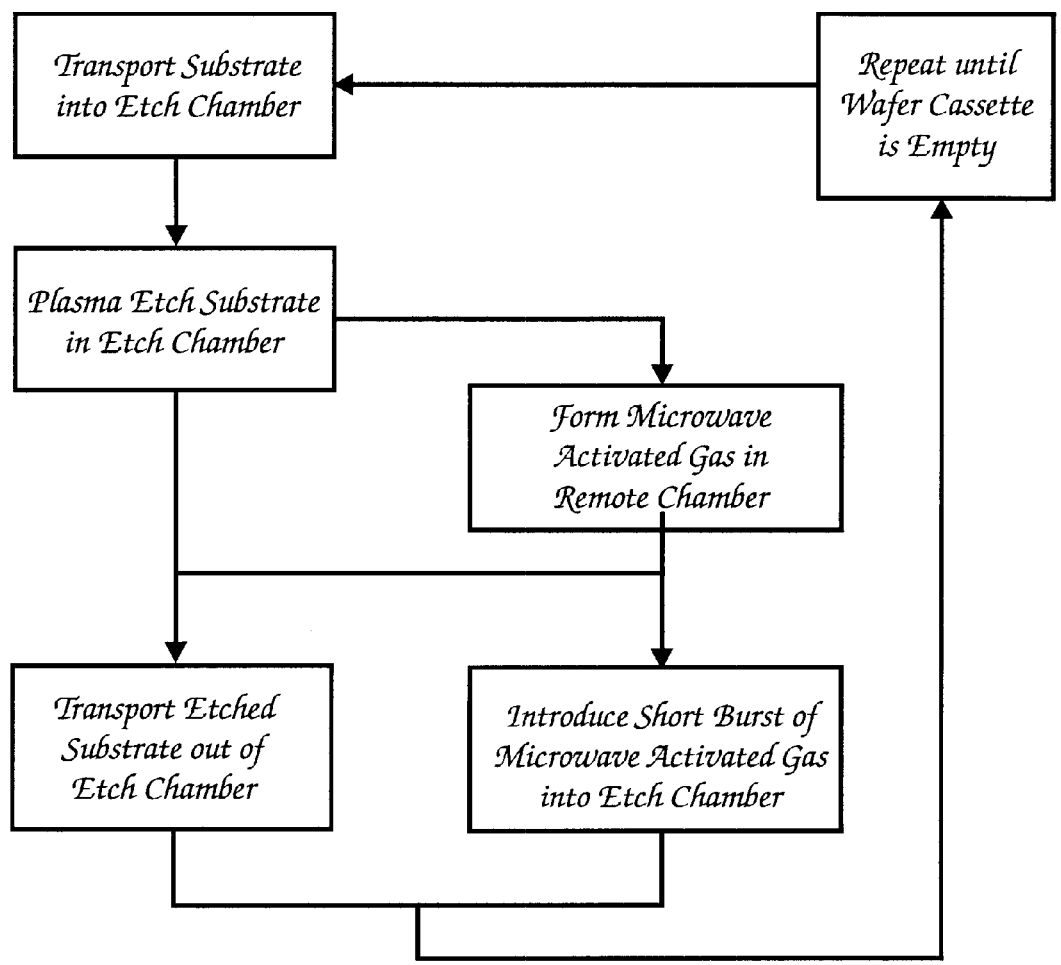
FIG. 2 is a flowchart of the process steps used to etch substrates and clean and condition the surface walls of the etching apparatus.

Referring to FIG. 2, a plasma is energized from the etchant gas using the plasma generator 110 by forming an inductive electric field in the chamber 30 and biasing the first and second electrodes 120, 125 in the chamber. The plasma is formed by applying an RF source current to the inductor antenna 115 encircling the chamber 30, and applying an RF bias voltage to the electrodes 120, 125. The etchant gas ionizes in the applied electric field to form halogen-containing ions and neutrals that react with the silicon-containing layers on the substrate 25 to etch the layers and form volatile gaseous species that are exhausted from the chamber 30. Preferably, the power ratio $P_r$ of the source current power level (to inductor antenna 115) to the bias voltage power level (to the process electrodes 120, 125) is selected to enhance the ability of the etchant plasma to anisotropically etch the silicon-containing layers with high selectivity relative to the overlying mask layer. Increasing the source power level of the current applied to the inductor antenna 115, increases the number of dissociated etchant species in the plasma providing more isotropic etching. In contrast, increasing the bias power level of the RF voltage applied to the process electrodes 120, 125 increases the degree of anisotropic etching by providing a higher bombardment energy component to the plasma ions. It has been discovered that an excessively high power ratio $P_r$ can cause sputtering of the substrate 25 and result in non-uniform etching of the substrate; while an excessively low power ratio $P_r$ can cause insufficient dissociation of the etchant gas into dissociated ions resulting in low etch rates and low etching selectivity. A preferred power ratio $P_r$ is at least about 2:1, and more preferably about 2:1 to about 20:1. The plasma is formed by applying a current at a source power level of about 400 to about 3000 Watts to the inductor antenna 115 encircling the plasma zone 35; and the plasma ions are is attracted toward the substrate 25 by applying a voltage at a power level of about 20 to about 1000 Watts to the process electrodes 120, 125 in the plasma zone.

The substrate 25 etching process is typically performed in a main etch stage and an "overetch" stage, in order to stop the etching process without etching through the underlayer on the substrate. The main etch stage is stopped immediately before the overlayer is completely etched through, and the overetch stage is performed to etch through the residual portion of the overlayer. Typically, the halogen content of the etchant gas is reduced in the overetch stage to obtain slower and more controllable etch rates. For example, a suitable main etch process stage for etching a polysilicon layer an etchant gas comprising 68 sccm $Cl_2$, 112 sccm HBr, and 16 sccm He—$O_2$ can be used. The power level of the source current applied to the inductor antenna 115 is 475 Watts, and the power level of the bias voltage applied to the process electrodes 120, 125 is 80 Watts to provide a power ratio $P_r$ of about 6:1. The pressure in the chamber 30 is held at 4 mTorr. A suitable over-etch process stage for the polysilicon layer uses an etchant process gas comprising 158 sccm HBr and 10 sccm He-$O_2$ at a chamber pressure of 50 mTorr. The power level of the source current applied to the inductor antenna 115 was 1000 Watts, and the power level of the bias voltage applied to the process electrodes 120, 125 was 100 Watts to provide a power ratio, $P_r$ of about 10:1, in the overetch process stage.

An optical endpoint measurement technique is used to determine completion of the entire etching process, or completion of etching of a specific layer by measuring the change in light emission of a particular wavelength corresponding to a detectable gaseous species. A sudden decrease or increase in concentration of a selected detectable species, indicates completion of etching of one or more of the layers. For example, a sudden increase in the concentration of silicon species (that results from chemical reaction of the process gas with the underlying polysilicon) indicates completion of the etching process; and an increase in chlorine ion concentration (resulting from reduced erosion of the underlayer) indicates completion of etching of the metal silicide layer and start of etching of the underlayer.

After completion of processing, the pneumatic lifting apparatus raises the lift pins through the electrostatic chuck 145 to raise the substrate 25 and a robotic transport arm is inserted between the substrate 25 and the chuck to lift the substrate off the lift pins. Thereafter, the lift pins are retracted into the chuck 145, and the robotic arm transports the substrate 25 out of the etching chamber 30 and into a transfer chamber maintained in a vacuum environment.

Cleaning & Conditioning Process

Thereafter, a treatment process is used to treat and recondition the surfaces inside the etching chamber 30, particularly the ceramic surfaces; and to clean the etch residue formed on the chamber walls 45, 50, 55 and components. The etch residue adheres and reacts with the surfaces inside the etching chamber 30, for example, the sidewalls 45, receiving surface 140 of the monolithic ceramic member 135, and the ceiling 55 of the chamber, to form a hard and chemically resistant layer that is difficult to remove. The etch residue typically comprise polymeric organic compounds containing halogen, carbon, hydrogen, oxygen, and/or silicon compounds that are formed during etching of the substrate 25. In particular, the etch residues react with the ceramic surfaces in the chamber 30 such as the surfaces of the monolithic ceramic member 135, which have highly reactive surface functional groups. For example, ceramic surfaces comprising silicon or silicon oxide comprise Si—OH⁻ surface groups which are formed when the ceramic surface is exposed to air, oxygen, or ambient moisture; and aluminum oxide or aluminum nitride surfaces have Al—OH⁻ surface groups. These surface functional groups chemically react with the etch residue to form a hard adherent coating on the chamber surfaces or components.

The chamber treatment process treats the chamber 30 to remove and reduce the adverse effect of the reaction byproducts of the etch residues and the chamber surfaces will now be described. To perform the process, the process chamber 30 is exhausted of etchant gas by fully opening the throttle valve 95 of the exhaust system 90. Cleaning gas, such as $NF_3$, $CF_4$, $SF_6$, $C_2F_6$, $CCl_4$, $C_2Cl_6$ or mixtures thereof, is introduced into the remote chamber 40 and activated therein, for example, by microwaves applied within the remote chamber by the microwave generator 185, or by RF energy applied via electrodes or an inductor coil. Thereafter, the activated cleaning gas is introduced into the etching chamber 30 to clean the etch residue in the chamber.

The power level $P_L$ of the current used to operate the gas activator 175 is selected to achieve two functions. In a first function, the cleaning gas should chemically react with and vaporize the thin layer of etch residue comprising polymer containing carbon, trapped halogen species, silicon, and/or hydrogen species, formed on the chamber surfaces. The flow rate $F_R$ of cleaning gas, and the power level $P_L$ of the gas activator 175 control the ratio of dissociated to non-dissociated species in the activated cleaning gas. The more highly dissociated gaseous species preferentially react with the thin etchant layer relative to the underlying chamber surfaces. That is why the activated plasma can remove thin layers of etch residue on the chamber walls, while minimizing erosion of the underlying chamber surfaces. In a second function, the activated cleaning gas reconditions the surfaces in the chamber 30, particularly the ceramic surfaces, after removing the etch residue. It has been discovered that halogen containing etch residue has high chemical reactivity to the chamber walls 45, 50, 55 and components, particularly when the etching chamber 30 contains ceramic surfaces that have highly reactive surface functional groups, such as the aforementioned Si—OH⁻, Al—OH⁻, and other such species. For example, fluorine containing species in the etch residue rapidly erode ceramic aluminum oxide or nitride surfaces to form volatile $AlF_3$, species. Similarly, bromine containing species hydrolyze in ambient moisture to form acidic hydrogen bromide which corrodes silicon-containing components. These types of etch residues need to be rapidly removed from the chamber 30 to prevent excessive erosion of the chamber surfaces. A high flow rate $F_R$ and low power level $P_L$ activated gas species conditions the chamber surfaces, i.e., restores at least a portion of the surface functional groups, such as AlOH⁻ groups, on the ceramic surfaces in the chamber 30. This returns the chamber surfaces to a chemical state similar to their original chemical state, thereby restoring their pristine surface activity and surface functionality, for the next etching process. As a result, the etching processes performed in the treated chamber 30 yield more reproducible results, as compared to chambers where a wet cleaning or an RIE cleaning process is used to clean the chamber.

Preferably, the flow rate $F_R$ of the cleaning gas and the power level $P_L$ of the current applied to the gas activator 175, such as the microwave plasma generator 185, are selected to vaporize the etch residue on the etching chamber surfaces to a sufficiently low concentration to remove their effect on the chamber gas composition and substrate contamination, without eroding the walls or components in the chamber 30. The flow rate $F_R$ of the cleaning gas should be sufficiently high to react with substantially all the etch residue on the ceramic surfaces to form gaseous byproducts. However, excessively high flow rates can cause erosion of the chamber walls and surfaces by the extended exposure to the highly activated gaseous species in the cleaning gas.

For example, it has been discovered that when etching silicon-containing layers on the substrate 25, a relatively thin etch residue containing primarily polymeric and silicon-containing species, and having a thickness of about 0.01 to about 1000 microns is formed on the chamber walls 45, 50, 55 and surfaces. This etch residue layer is removed by introducing into the chamber 30, an activated cleaning gas at a flow rate $F_R$ equivalent to a rate of about 200 to about 2000 sccm for a chamber having a volume of about 40,000 $cm^3$ for a time period of about 0.5 to 100 seconds to clean the etch residue, substantially without eroding the walls and components in the chamber. For different sized process chambers, equivalent flow rates of cleaning gas compositions that maintain substantially the same ratio of $NF_3$ flow in sccm to chamber volume in $cm^3$ should be used. While process gas consisting only of $NF_3$ provides good results, inert gases such as helium or argon can also be added to the process gas, or the process gas can comprise a commercially available mixture of gases, such as He—$O_2$.

When a gas activator 175 which comprises a microwave generator 185 is used, the power level $P_L$ operating the microwave generator 185, which is also a measure of the power or intensity of microwaves applied to the remote plasma chamber 40 via the gas activator 175, is selected to clean and treat the chamber 30 surfaces without eroding the chamber walls. The power level should be sufficiently high to provide a cleaning gas that is sufficiently reactive to remove substantially all the etch residue on the chamber walls and components without damage to the underlying structures. An excessively high power level $P_L$ will cause the highly activated gaseous species to erode the chamber walls. Conversely, a cleaning gas activated at a power level that is too low, will fail to remove the thick chemically hard etch residue on portions of the chamber walls and components. Suitable power levels for the $NF_3$ cleaning gas are from about 500 to about 4000 watts, and more preferably, from about 1500 to about 2500.

The activated gaseous species are introduced into the etching chamber 30 for a short burst of time to treat and condition the chamber. The short burst of activated cleaning gas provides significant advantages over conventional cleaning processes. First, the burst of activated cleaning gas provides a larger number of highly dissociated species that removes the etch residues, and cleans and conditions the ceramic surfaces in the chamber 30 by a "soft" chemically reactive process performed by the highly chemically reactive dissociated species. The burst and quick removal of the cleaning gas from the chamber 30 also reduces the possibility of dissociated species from recombining to form other chemical species that erode the chamber surfaces and components. This mechanism is further aided by the high flow rates of the burst of gas which assist in flushing out the reaction byproducts before they recombine in the chamber 30. Also, the burst of gas maintains a fresh supply of cleaning gas at the exposed surfaces of the etch residue during the cleaning operation thereby removing the residue layers at a fast rate. Preferably, the burst of activated cleaning gas is introduced into the etching chamber at a flow rate $F_R$ equivalent to a rate of at least about 200 to about 2000 sccm for an etching chamber 30 having a volume of about 40,000 cm$^3$ for a time period of about 0.5 to about 100 seconds to clean the etch residue, substantially without eroding the walls and components in the chamber. More preferably, the remotely generated cleaning gas is introduced into the etching chamber for about 0.5 to about 24 seconds.

In another aspect of the present invention, useful for reducing equipment down time and increasing throughput of the etching chamber 30, the cleaning process is performed while transporting the substrate 25 out of the chamber, or immediately after the substrate 25 is removed from the etching chamber 30. In this version, activated cleaning gas is prepared in the remote chamber 40, and while simultaneously transporting the substrate 25 out of the etching chamber 30, a burst of high flow rate $F_R$ of activated cleaning gas is introduced into the etching chamber 30 for a time period sufficient to treat and condition the surfaces of the etching chamber 30 substantially without eroding the surfaces. For example, as the substrate 25 is finishing etching, the cleaning gas is introduced into the remote chamber 40 by opening an inlet valve 205 in the gas line between the cleaning gas supply 200 and the remote chamber 40; and the activated cleaning gas is allowed to flow into the etching chamber 30 while the substrate is being removed from the etching chamber 30. Inlet valve 205 of the remote chamber is in a closed position during etching of the substrate, and as the etched substrate 25 is being removed or transported from the etching chamber 30, for example, while the substrate 25 is passing through the slit valve at the sidewall 45 of the etching chamber, a robot controller 259 sends a first signal that opens the inlet valve 205 to allow cleaning gas to enter into the remote chamber 40. For example, the robot controller 259 can provide a first trigger signal to the computer control system 230 that in response opens the inlet valve 205 and actuates the microwave generator 185, forming activated cleaning gas. The cleaning gas flows into the etching chamber 30 for a short time period to clean and condition the surfaces in the chamber 30. The robot controller 259 then provides a second trigger signal that closes the inlet valve 205 when a second substrate 25 is retrieved for insertion into the etching chamber 30 and allows the exhaust system 90 to exhaust residual activated gas from the etching chamber. Thereafter, another substrate 25 is transported into the chamber 30 and the etching, transportation, and chamber cleaning and conditioning steps are repeated, until all substrates 25 supply have been processed. In this method, the etching process stages are not delayed or slowed down by the cleaning process stages, thereby providing improved processing throughput.

In yet another version, an outlet valve 225 from the remote chamber is in a closed position during activation of the cleaning gas. As the etched substrate 25 is removed or transported from the etching chamber 30, the robot controller 259 sends a first signal that opens the outlet valve 225 in the gas conduit 170 allowing activated cleaning gas to flow into the etching chamber 30 for a short time period to clean and condition the surfaces in the chamber. The robot controller 259 then provides a second trigger signal that closes the outlet valve 225 when a second substrate 25 is retrieved for insertion into the etching chamber 30. Thereafter, another substrate 25 is transported into the chamber 30 and the etching, transportation, and chamber cleaning and conditioning steps are repeated.

In yet another aspect of the present invention, a lower pressure of gas is maintained in the etching chamber 30 relative to the pressure in the remote chamber 40. This aspect of the present invention can be used in conjunction with the specialized gas distributor structures described above to direct the flow of cleaning gas adjacent to particular chamber surfaces that need to be cleaned more vigorously, for example, by providing the cleaning gas injection nozzles 235 adjacent to, or facing the portions of chamber having thicker etchant residues. It is believed that a more rapid flow of activated cleaning gas enters into the process chamber because of the differential pressure maintained between the two chambers, causing the cleaning gas to rapidly impinge against and clean the chamber surfaces. In this process, the interior volume of the etching chamber 30 is maintained at a higher pressure than the remote chamber 40. In this method, the etching chamber 30 is preferably maintained at a lower pressure than the remote chamber 40. The etching chamber 30 is preferably maintained at a pressure of 0.1 to 80 mTorr, and the remote chamber 40 is maintained at a pressure of about 500 to about 3000 mTorr.

In another preferred aspect of the invention, useful for cleaning and conditioning chamber surfaces that are highly reactive to the etch residue, such as the ceramic surfaces, a multicycle cleaning process is used to treat chamber surfaces and reduce the concentration of etch residue. In a first stage, a first activated cleaning gas is formed by maintaining the gas activator 175, such as the microwave generator 185, at a first power level. In at least one second stage, a second activated cleaning gas is formed by maintaining the gas activator 175 at a second power level that is lower than the first power level. The cleaning gas activated by the first higher power level of the first cleaning stage provides a more dissociated and chemically reactive species that removes the hard and thick etch residues on portions of the chamber walls 45, 50, 55 and components that are near the substrate 25. The cleaning gas in the second cleaning stage is activated at a lower power level to efficiently treat and condition surfaces such as the ceramic surfaces, to provide optimal etching conditions in the chamber 30. Preferably in another version, the first power level is at least about 500 watts, and more preferably from about 500 to about 3000 watts; and the second power level is at least about 1000 watts, and more preferably about 1500 to about 4000 watts. The multiple power level process is repeated a sufficient number of times to treat the chamber walls to reduce the concentration of etch residue in the chamber 30 to the desirable level, typically from a single cycle, to a range of about 1 to about 10 cycles. The duration of each cleaning stage is from about 0.5 to about 100 seconds, and more preferably, from about 2 to about 30 seconds.

The chamber treatment process of the present invention is advantageous because it maximizes the chemical reactivity of the activated cleaning gas to the etch residues in the chamber 30, and minimizes the chemical reactivity of the cleaning gas to the exposed surfaces in the etching chamber 30. The cleaning process has been found to uniformly remove etch residues, irrespective of their thickness or chemical stoichiometry. Prior art cleaning processes, particularly those performed by an operator, often fail to uniformly clean and remove the etch residue deposits formed on chamber surfaces. Build-up of etchant deposits on the chamber surfaces, result in flaking off the etchant deposits and contamination of the substrate 25 etched in the chamber. By uniformly removing the etch residues formed across substantially all of the chamber surfaces, such contamination and reduced yields from the substrate 25, are minimized.

The activated cleaning gas also results in far less erosive damage to the chamber compared to conventional in-situ plasma cleaning steps, because of the reduced energy levels of the plasma in the etching chamber. This was difficult to accomplish in prior art processes, in which the high powered plasmas used to remove the residue deposits also resulted in extensive erosion of chamber surfaces and components. By reducing the need to replace chamber components, the cost of operating the etching chamber 30 and the cost per substrate 25 are significantly reduced. Furthermore, the activated cleaning gas can be used to efficiently clean an etch chamber 30 in-situ during etching of substrates 25, and preferably during transport of the substrates between the etching chamber 30 and the loading chamber, rather than stopping processing in the chamber 30 to wet clean the chamber walls and components, thereby increasing etching throughput and further reducing costs per substrate. The cleaning process is expected to increase chamber lifetimes by a factor of at least 2, and also increase substrate yields by reducing the deposition of flaked-off etchant byproducts onto the substrate.

The treatment and cleaning process removes chemically-adhered etchant deposits from active surfaces in the chamber 30, and restores the original chemical reactivity and surface functional groups of these surfaces. The cleaning and treatment process is also particularly useful for cleaning etch residue that is strongly adhered to, or chemically reacted with ceramic surfaces, such as surfaces comprising one or more of aluminum nitride, boron carbide, boron nitride, diamond, silicon oxide, silicon carbide, silicon nitride, titanium oxide, titanium carbide, yttrium oxide, and zirconium oxide. The activated cleaning gas is effective at treating and reconditioning these ceramic surfaces to provide surface chemistries and surface functional groups that are chemically compatible with the etching process. The conditioned ceramic surfaces provide more reproducible etching properties in the chamber 30, than that provided by alternative chamber cleaning processes, such as wet cleaning or RIE cleaning processes. The significantly improved reproducibility of etching processes performed in the chamber 30 is highly desirable.

The present invention has been described With reference to certain preferred versions thereof; however, other versions are possible. For example, the treatment and cleaning process of the present invention can be used for treating chambers for other applications, as would be apparent to one of ordinary skill. For example, the process can be applied, as would be apparent to one of ordinary skill in the art, to treat sputtering chambers, ion implantation chambers, or deposition chambers, or in combination with other cleaning processes. Therefore, the spirit and scope of the appended claims should not be limited to the description of the preferred versions contained herein.

What is claimed is:

1. A method of etching a substrate and treating surfaces in an etching chamber, the method comprising the steps of:
   (a) etching the substrate in the etching chamber thereby depositing etch residue on the surfaces in the etching chamber; and
   (b) transporting the substrate out of the etching chamber while providing activated cleaning gas in the etching chamber under process conditions selected to treat the surfaces of the etching chamber.

2. A method according to claim 1 wherein in step (b) the activated cleaning gas is provided in the etching chamber at a flow rate equivalent to a rate of from about 200 to about 2000 sccm for a chamber having a volume of about 40,000 $cm^3$ and for a time period of from about 0.5 to about 100 seconds.

3. A method according to claim 2 wherein the activated cleaning gas is introduced into the etching chamber for from about 0.5 to about 24 seconds.

4. A method according to claim 1 wherein the activated cleaning gas is activated by microwaves applied in a remote chamber by a microwave plasma generator operated at a power level of from about 500 to about 4000 Watts and the cleaning gas is then introduced into the etching chamber.

5. A method according to claim 4 wherein the etching chamber is maintained at a lower pressure than the remote chamber.

6. A method according to claim 5 wherein the etching chamber is maintained at a pressure of from about 0.1 to about 80 mTorr, and the remote chamber is maintained at a pressure of from about 500 to about 3000 mTorr.

7. A method according to claim 1 wherein the surfaces in the etching chamber comprise one or more of aluminum nitride, boron carbide, boron nitride, diamond, silicon oxide, silicon carbide, silicon nitride, titanium oxide, titanium carbide, yttrium oxide, and zirconium oxide.

8. A method for treating an etching chamber to remove etch residue deposited on surfaces in the etching chamber during the etching of a substrate, the method comprising the steps of providing a burst of activated cleaning gas in the etching chamber at a flow rate equivalent to a rate of from about 200 to about 2000 sccm for an etching chamber having a volume of about 40,000 $cm^3$ and for a time period of from about 0.5 to about 100 seconds under process conditions selected to clean the etch residue.

9. A method according to claim 8 wherein the activated cleaning gas is introduced into the etching chamber for from about 0.5 to about 24 seconds.

10. A method according to claim 8 wherein the cleaning gas is activated by microwaves applied in a remote chamber by a microwave plasma generator operated at a power level of from about 500 to about 4000 Watts.

11. A method according to claim 10 wherein the etching chamber is maintained at a lower pressure than the remote chamber.

12. A method according to claim 11 wherein the etching chamber is maintained at a pressure of from about 0.1 to about 80 mTorr, and the remote chamber is maintained at a pressure of from about 500 to about 3000 mTorr.

13. A method according to claim 8 wherein the surfaces in the etching chamber comprise one or more of aluminum nitride, boron carbide, boron nitride, diamond, silicon oxide, silicon carbide, silicon nitride, titanium oxide, titanium carbide, yttrium oxide, and zirconium oxide.

14. A method according to claim 1 wherein the step of etching the substrate comprises etching a layer on the substrate, the layer comprising silicon oxide, silicon nitride, silicon, polysilicon, or other silicon containing materials.

15. A method according to claim 8 further comprising the step of etching a layer on the substrate, the layer comprising silicon oxide, silicon nitride, silicon, polysilicon, or other silicon containing materials.

16. A method according to claim 1 wherein the etch residue comprises a layer containing polymeric and silicon containing species that form on the surfaces during the etching of the substrate.

17. A method according to claim 8 wherein the etch residue comprises a layer containing polymeric and silicon containing species that form on the surfaces during the etching of the substrate.

18. A method according to claim 1 wherein the step of etching the substrate comprises etching a dielectric layer on the substrate.

19. A method according to claim 18 wherein the dielectric layer contains silicon.

20. A method according to claim 8 further comprising the initial step of etching a substrate comprising a dielectric layer.

21. A method according to claim 20 wherein the dielectric layer contains silicon.

22. A method of etching a substrate and cleaning an etching chamber, the method comprising the steps of:
(a) etching a substrate in the etching chamber and thereby depositing etch residue on surfaces in the etching chamber;
(b) providing a cleaning gas in a remote chamber and maintaining the cleaning gas at a pressure of from about 500 to about 3000 mTorr;
(c) activating the cleaning gas in the remote chamber to form an activated gas using a power of from about 1500 watts to about 2500 watts; and
(d) flowing the activated gas from the remote chamber into the etching chamber under flow conditions selected to remove the etch residue from surfaces in the etching chamber without excessive erosion of the surfaces, and maintaining the activated cleaning gas at a pressure of from about 0.1 to about 80 mTorr.

23. A method according to claim 22 wherein the cleaning gas is selected from the group consisting of $NF_3$, $CF_4$, $SF_6$, $C_2F_6$, $CCl_4$, $C_2Cl_6$, and mixtures thereof.

24. A method according to claim 22 wherein the step of activating the cleaning gas comprises providing microwaves to the cleaning gas.

25. A method of cleaning a process chamber, the method comprising the steps of:
(a) providing a cleaning gas in a remote chamber, the remote chamber being maintained at a pressure of from about 500 mTorr to about 3000 mTorr;
(b) activating the cleaning gas in the remote chamber at a power level of from about 1500 watts to about 2500 watts, thereby forming activated gas; and
(c) flowing the activated gas from the remote chamber into the process chamber, the process chamber being maintained at a pressure of from about 0.1 mTorr to about 80 mTorr.

26. A method according to claim 1 wherein the surfaces are surfaces of walls and components in the etching chamber.

27. A method according to claim 1 wherein the etch residue is nonhomogeneous.

28. A method according to claim 1 wherein the activated cleaning gas is provided under process conditions selected to treat the surfaces of the etching chamber substantially without eroding the surfaces.

29. A method according to claim 1 wherein the cleaning gas is activated by RF energy provided by a capacitively or inductively coupled source.

30. A method according to claim 29 wherein the cleaning gas is activated in a remote chamber.

31. A method according to claim 8 wherein the surfaces are surfaces of walls and components in the etching chamber.

32. A method according to claim 8 wherein the etch residue is nonhomogeneous.

33. A method according to claim 8 wherein the burst of activated cleaning gas is provided under process conditions selected to treat the surfaces of the etching chamber substantially without eroding the surfaces.

34. A method according to claim 8 wherein the cleaning gas is activated by RF energy provided by a capacitively or inductively coupled source.

35. A method according to claim 34 wherein the cleaning gas is activated in a remote chamber.

36. A method of etching a substrate and cleaning an etching chamber, the method comprising the steps of:
(a) etching a substrate in the etching chamber and thereby depositing etch residue on surfaces in the etching chamber;
(b) providing a cleaning gas in a remote chamber;
(c) activating the cleaning gas in the remote chamber to form an activated cleaning gas; and
(d) cleaning the etch residue on the surfaces in the etching chamber by introducing the activated cleaning gas into the etching chamber at a flow rate equivalent to a rate of from about 200 to about 2000 sccm for a chamber having a volume of about 40,000 $cm^3$ and for a time period of from about 0.5 to about 100 seconds.

37. A method according to claim 36 wherein the activated cleaning gas is introduced into the etching chamber for from about 0.5 to about 24 seconds.

38. A method according to claim 36 wherein the cleaning gas is selected from the group consisting of $NF_3$, $CF_4$, $SF_6$, $C_2F_6$, $CCl_4$, $C_2Cl_6$, and mixtures thereof.

39. A method according to claim 36 wherein the step of etching the substrate comprises etching a layer on the substrate, the layer comprising silicon oxide, silicon nitride, silicon, polysilicon, or other silicon containing materials.

40. A method of etching a substrate and cleaning an etching chamber, the method comprising the steps of:
(a) etching a substrate in the etching chamber, thereby depositing etch residue on surfaces in the etching chamber; and
(b) cleaning the etch residue on the surfaces in the etching chamber by providing activated cleaning gas in the etching chamber at a flow rate equivalent to a rate of from about 200 to about 2000 sccm for a chamber having a volume of about 40,000 $cm^3$ and for a time period of from about 0.5 to about 100 seconds.

41. A method according to claim 40 wherein the activated cleaning gas is provided in the etching chamber for from about 0.5 to about 24 seconds.

42. A method according to claim 40 wherein the cleaning gas is selected from the group consisting of $NF_3$, $CF_4$, $SF_6$, $C_2F_6$, $CCl_4$, $C_2Cl_6$, and mixture thereof.

43. A method according to claim 40 wherein the cleaning gas comprises a fluorine species.

44. A method of etching a substrate and cleaning etch residue deposited on surfaces in an etching chamber, the method comprising the steps of:
(a) etching a substrate in the etching chamber and thereby depositing etch residue on the surfaces in the etching chamber;
(b) providing a cleaning gas in a remote chamber;
(c) activating the cleaning gas inside the remote chamber to form an activated cleaning gas; and
(d) cleaning the etch residue on the surfaces of walls and components of the etching chamber by introducing the activated cleaning gas into the etching chamber, wherein the etching chamber is maintained at a pressure of from about 0.1 to about 80 mTorr, and the remote chamber is maintained at a pressure of from about 500 to about 3000 mTorr.

45. A method according to claim 44 herein the activated cleaning gas is introduced into the etching chamber at a flow rate equivalent to a rate of from about 200 to about 2000 sccm for a chamber having a volume of about 40,000 $cm^3$ and for a time period of from about 0.5 to about 100 seconds.

46. A method according to claim 44 herein the cleaning gas is selected from the group consisting of $NF_3$, $CF_4$, $SF_6$, $C_2F_6$, $CCl_4$, $C_2Cl_6$, and mixtures thereof.

47. A method according to claim 44 herein the cleaning gas comprises a fluorine species.

* * * * *